US005589039A

United States Patent [19]

Hsu

[11] Patent Number: 5,589,039
[45] Date of Patent: Dec. 31, 1996

[54] IN-PLANE PARALLEL BIAS MAGNETIC FIELD GENERATOR FOR SPUTTER COATING MAGNETIC MATERIALS ONTO SUBSTRATES

[75] Inventor: Jon S. Hsu, Taipei, Taiwan

[73] Assignees: Sony Corporation, Tokyo, Japan; Materials Research Corporation, Orangeburg, N.Y.

[21] Appl. No.: 508,865

[22] Filed: Jul. 28, 1995

[51] Int. Cl.[6] .................................................. C23C 14/34
[52] U.S. Cl. .............................. 204/192.12; 204/192.2; 204/298.15; 204/298.16
[58] Field of Search ................................... 156/345, 643; 204/192.12, 192.2, 298.16, 298.15, 298.19, 298.2

[56] References Cited

U.S. PATENT DOCUMENTS

| | | | |
|---|---|---|---|
| 4,422,896 | 12/1983 | Class et al. | 156/643 |
| 4,525,262 | 6/1985 | Class et al. | 204/192 R |
| 4,581,118 | 4/1986 | Class et al. | 204/298 |
| 4,657,619 | 4/1987 | O'Donnell | 156/345 |
| 5,415,754 | 5/1995 | Manley | 204/192.19 X |
| 5,458,759 | 10/1995 | Hosokawa et al. | 204/192.19 X |

*Primary Examiner*—Nam Nguyen
*Attorney, Agent, or Firm*—Wood, Herron & Evans, P.L.L.

[57] ABSTRACT

Magnetic domains in a thin magnetic film on information storage devices are aligned during manufacture of the device, preferably at the time the film is deposited onto a substrate by sputtering. A compact magnetic field generator generates a parallel magnetic field across the substrate with a magnet assembly that is not larger than approximately twice the size of the substrate or not larger than the sputtering target cathode assembly. The magnet assembly includes an interior magnet with poles at opposite ends of the substrate and two side magnets having pole pieces spaced by an air gap from the poles of the interior magnet. The interior magnet preferably includes a central magnet and two intermediate magnets, which share the same pole pieces as the central magnet. The interior magnets are located between the central magnet and the side magnets. The magnets, which are preferably electromagnets, are adjusted by varying the current therethrough, preferably by adjusting the current of the intermediate magnets, or by moving the pole pieces to adjust the gaps between those of the side and interior magnets, until the field is parallel to within one degree. Magnetic devices, such as read and write heads, are produced from products of the process.

15 Claims, 5 Drawing Sheets

IN-PLANE PARALLEL BIAS MAGNETIC FIELD GENERATOR FOR SPUTTER COATING MAGNETIC MATERIALS ONTO SUBSTRATES

The present invention relates to the production of magnetically aligned magnetic films on substrates, and more particularly to a method and apparatus for producing highly aligned magnetic films during the application of the film to a substrate, particularly during application by sputtering.

BACKGROUND OF THE INVENTION

The reading and writing of magnetic information and, more generally, the generation and sensing of discrete magnetic fields, is an art applicable to the recording and retrieving of digital information. In such applications, the increasing demands for higher information density on the recording media and for faster and more reliable transfer of information between read or write heads and magnetic storage media increase the need for devices that will provide high reading sensitivity, high information density, low noise and high speed switching. Such needs result in the imposition of requirements on the properties of magnetic materials used in the processes of information transfer between circuits and storage media. Generally, in such processes, it is better to use products that sense magnetic fields while interfering as little as possible with the magnetic field that is being sensed.

In magnetic read-write heads that are used in the recording and retrieval of digital information from magnetic discs or other such storage devices, the material used in the manufacture of the magnetic head provides a magnetically sensitive path through which magnetic flux must easily pass. Increased demands of industry for higher storage capacity and smaller devices, and thus higher storage information density and higher transfer rates, require better and more efficient magnetic materials for use in the reading and writing heads.

For example, with Giant Magneto-Resistive (GMR) devices such as those used as read heads for digital magnetic discs, sputter coated thin films of soft magnetic material are used for the sensing elements. In such elements, the size, shape, composition and magnetic orientation of the magnetic domains of this magnetic material affect the performance of the heads in facilitating high speed, high sensitivity switching through the creation and annihilation of domain walls. In such uses, alignment of the domains of the magnetic material with the magnetic fields being sensed increases the high speed, high sensitivity reading of information of the heads by, for example, reducing a phenomenon referred to as Barkhausen noise. One way to reduce this Barkhausen noise and to otherwise increase the sensitivity of the magnetic material film has been to provide a bias magnetic field to align the domains of the thin film of magnetic material on the head.

Demands for improved material films have resulted in demands to increase the degree of parallelism in the alignment of the magnetic domains, increasing the requirements for the parallelism of the fields used in aligning the domains to, for example, within one angular degree. In response to such demands, the domain alignment property has been typically controlled by placing a strong magnetic field in the vicinity of the manufactured substrate of which the devices are to be formed that have thereon the magnetic alloy layer, and then subjecting the substrate to post-processing in the form of heat treating or annealing in the presence of the magnetic field. Such treatment in the magnetic field causes the magnetic material domains to realign to achieve the desired magnetic orientation.

Magnetic structures used to generate the parallel magnetic fields for processing of the magnetic devices to align the domains generally produce a region in space at which the fields are sufficiently parallel. However, as distance increases from the center of the region, the magnetic field lines tend to diverge, resulting in insufficient parallelism of the field beyond a certain distance from the center. As a result, only a small substrate, or a small area on a substrate is exposed to a sufficiently parallel field to produce high quality devices. Such an area may be a two to four inch diameter area on a 6×6 inch wafer. Where, under present economic circumstances, the ultimate devices being manufactured from a single substrate may have a retail value of upward of one million U.S. dollars, and where, up to the time of the deposition of the magnetic film, the cost already incurred in processing the wafer may be several hundred thousand U.S. dollars, the ability to commercially use only a small wafer or small portion of a wafer, for example less than 30%, results in a substantial loss in potential product value. The size of the useful area of such a wafer can be increased by increasing the size of the portion of the field that is acceptably parallel. Increasing the size of the portion of the field that is acceptably parallel can be achieved by increasing the size of the biasing magnet structure. However, as the magnet is increased in size, the overall strength of the field diminishes since the saturation of the field in the magnet cannot be increased in proportion to magnet size.

Furthermore, providing the domain alignment in a post-processing step after the deposition of the magnetic film onto the substrate increases the cost of the devices and the time of the device production process. It accordingly would be desirable to subject the wafer to the bias magnetic field during the process by which the thin magnetic film is being deposited. However, in such deposition processes which are performed in vacuum processing machines which, for many reasons, are preferably limited in size, large magnets and magnetic field orienting devices are unacceptable and cannot be practically placed within or in operative relationship with the processing chambers of such machines.

Accordingly, there is an increasing need for a method and apparatus that will provide a sufficiently strong magnetic field having a high degree of parallelism, for example to within one angular degree, over a large substrate area, and that occupies a small space, preferably to fit within the confines of a thin film deposition apparatus.

SUMMARY OF THE INVENTION

It is an objective of the present invention to provide a method and apparatus for producing, over a large area, a strong magnetic field having a high degree of parallelism and which occupies a space that is small in relation to the size of the area over which the field is parallel. More particularly, it is an objective of the present invention to provide a magnetic field generating device for aligning the domains of a sputtered magnetic thin film during a sputter deposition operation.

It is a further objective of the present invention to provide a method and compact apparatus for producing a highly parallel magnetic field over a substantially large space, and providing for the trimming, fine tuning or fine adjustment of the field in the environment of the apparatus.

In accordance with the principles of the present invention, there is provided a biasing magnet structure for producing a parallel magnetic field that extends parallel to a substrate on which a magnetic film is being or has been deposited and which extends over an area of the substrate that occupies a major portion of the magnet structure, and preferably at least one half to two-thirds the diameter of the magnet structure. Further in accordance with the principles of the present invention, the magnet structure has an overall size comparable to the size of a sputtering cathode assembly used in sputter coating the magnetic material onto the substrate, and preferably will fit into a sputtering system to magnetically bias the substrate during sputter deposition of the film.

In accordance with the preferred embodiment of the present invention, there is provided a configuration of magnets for producing a magnetic field that is the resultant of separately generated and preferably relatively adjustable component static magnetic fields, preferably three in number. In the preferred embodiment, the first component magnetic field is produced by a central bipolar magnet structure that generates a constant magnetic field parallel to the substrate and generally symmetrical about a centerline of the substrate, which field diverges transversely at the sides of the substrate. The second component magnetic field includes a pair of equal bipolar magnet structures spaced at preferably equal distances on opposite sides of the central magnet structure to produce a field that is generally parallel toward the interior thereof. This second field also generally diverges at the sides of the substrate and transversely widens the area of parallelism of resulting combined first and second fields. The first and second magnet structures preferably share at least one common end pole piece at each of the opposite ends thereof. The third component magnetic field includes a pair of equal bipolar magnet structures spaced on opposite sides of the combination of the first and second structures, and which have separate end pole pieces spaced by an air gap from the common end pole pieces of the first and second magnet structures. These end pole pieces each have at least one outside corner facing diagonally toward a substrate support near a corner thereof. All of the magnet structures have parallel polar axes. The shape and arrangement of the end pole pieces of the third magnet structures are such as to produce a field that longitudinally supports the field of the first and second magnet structures but which transversely opposes the diverging portion of that field, thereby canceling the transverse field in the region of the substrate to render the resultant field parallel to a high degree in substantially the entire region occupied by the substrate. In the production of the configuration of magnets, the relative strengths of the magnets as well as the size of the air gap spacing of the poles is adjusted to cancel the transverse field and produce the parallel resultant field.

The preferred embodiment of the invention employs a set of ten magnets arranged in five bipolar pairs through an interconnection central pole. The magnets are preferably electromagnets that can be controlled by controlling the currents through their windings. Alternatively, permanent magnets may be used that are adjustable by physical movement. The magnets are adjusted preferably by setting the strength of the central magnet and then by setting the strengths of the two second magnet sets adjacent the central magnet to obtain generally uniform fields near the center. Then the third or outer magnet sets are adjusted to generally cancel the transverse components of the other two magnet sets, or until the field at the edges of the substrate is roughly parallel to that at the center. The magnets of the second set are then preferably readjusted to optimize the parallelism of the field across the wafer to within the degree desired. Where electromagnets are employed, magnet current adjustments are made to adjust the magnet strength and thus the parallelism of the field. The gap between the end poles of the side magnets, or magnets of the third set, and the pole pieces of the interior magnets, or central and intermediate magnets of the first and second sets, can also be adjusted to achieve the desired results.

Preferably, for a six inch square wafer, end pole pieces for the magnets of the central and intermediate sets are approximately seven inches in width and are spaced about ten inches apart. The end pole pieces of the trimming magnets are preferably either rectangular or stepped, having at least one inwardly facing corner, and are spaced about six inches from each other and about one half inch from the sides of the central magnet pole pieces. The entire assembly is approximately the size of a twelve inch target and less than twice the diameter of the substrate, and can thus be used in the sputtering or other deposition apparatus during the process by which the magnetic material is deposited.

In the preferred electromagnet embodiment, the electromagnets are each formed of coils of about one and one-half inches in outside diameter wrapped around round or square cores of about one-half inch in diameter. The cores are made of high saturation material, e.g. about 24 kGauss, with a high permeability of eight to ten thousand, and are interconnected by similar material outside of the plane of the substrate to define a closed loop.

With the magnet arrangement of the present invention, a bias field is produced that is within one angular degree of parallelism over the six by six inch extent of a square wafer. The magnet assembly can be contained within a sputtering apparatus and will be therein generally confined within the diameter of the sputtering target. Thus, a large wafer can be coated with an acceptably aligned magnetic film on its entire area. As a result, a dramatic reduction in the unit cost and potential unit price of the device is realized.

These and other objectives of the present invention can be appreciated form the following detailed description of the drawings in which:

DETAILED DESCRIPTION OF THE PREFERRED EMBODIMENT

Figure 1:
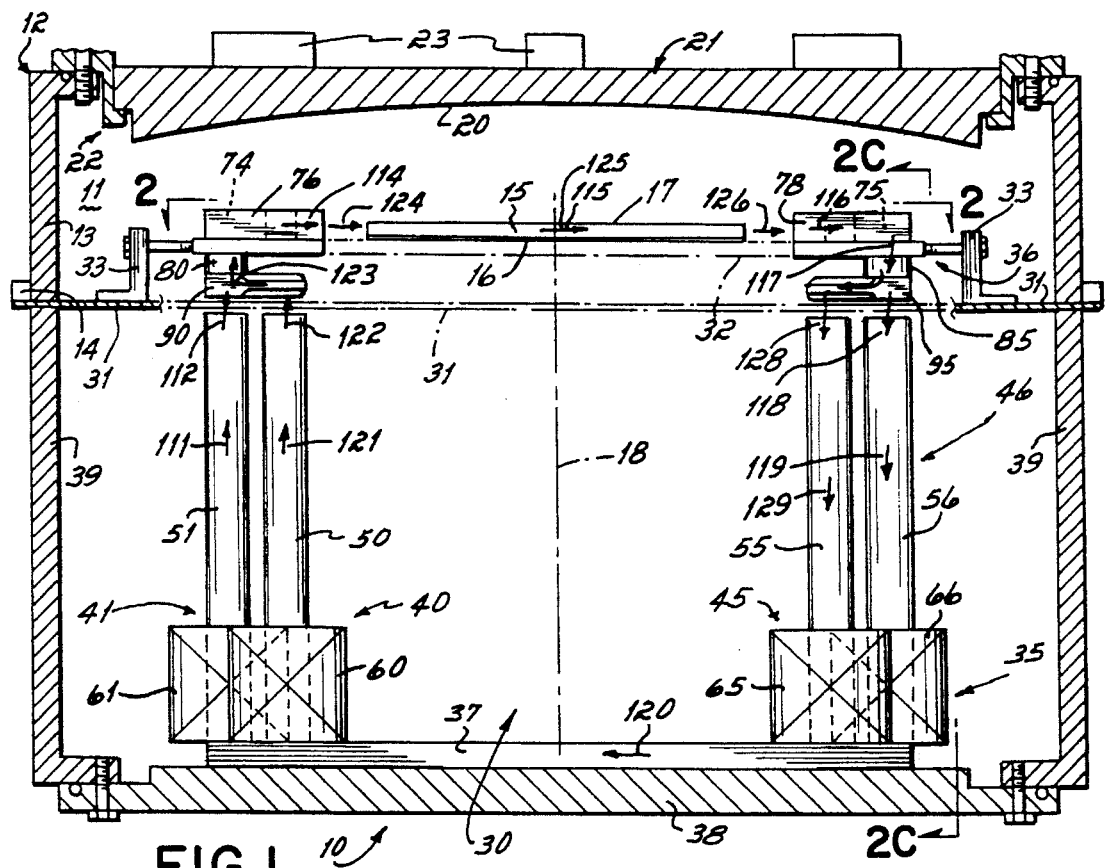
FIG. 1 is a cross sectional elevational view of a sputtering chamber of a sputtering machine having a biasing magnet assembly according to one preferred embodiment of the present invention.

Referring to FIG. 1, a biasing magnet assembly 10, according to one preferred embodiment of the invention, is illustrated in a vacuum chamber 11 of a sputtering machine 12, of which only a sputtering chamber thereof is illustrated. The chamber 11 is bounded by a chamber wall 13, which is usually fixed to apparatus frame 14. Sputtering machines 12 of a variety of types are suitable for the deposition of thin films of magnetic material on wafer substrates. Examples of such machines, and the sputtering chambers and cathode assemblies thereof, are disclosed in detail in U.S. Pat. Nos. 4,909,685, 4,957,605, 5,080,772 and 5,130,005, hereby expressly incorporated by reference herein. Chamber 11 in FIG. 1 is a simplified diagrammatic representation of the chambers of all such machines.

In the vacuum chamber 11, a wafer 15 is mounted for processing on a wafer support 16, which makes a thermal and electrical contact, through circuits not shown, with the back of the wafer 15, and either maintains the wafer 15 at a ground potential or at a potential biased to some voltage relative to ground. The wafer 15, in the example illustrated, is a 6×6 inch square wafer, and is supported on the support 16 such that it presents a surface 17 which faces through the space of the sputtering chamber 11 toward sputtering surface 20 of a sputtering target 21, mounted parallel to and opposite the support 16, in a target cathode assembly 22. For six to eight inch diameter wafers 15, the target 21 is preferably circular and twelve or fourteen inches in diameter. The target 21 and the wafer 15 are generally symmetrical about a transverse centerline lying in a transverse plane, illustrated as plane 18 in FIG. 1 through the chamber 11.

In most machines 12, the target cathode assembly 22 is a magnetron sputtering cathode that includes fixed or rotating cathode magnets 23 behind the target 21, on the opposite side thereof from the sputtering surface 20. Various types of cathode magnets 23 are described in the patents incorporated by reference above. The target 21 is mounted to the target cathode assembly 22 so as to be in thermal and electrical contact with portions of the assembly 22, to maintain the target at a negative potential, so that, when the target 21 and magnets 23 are energized by a power supply connected therebetween, a plasma is formed in the vacuum chamber 11, which is usually filled with a low pressure inert gas such as argon.

In a sputter coating operation performed in the chamber 11, positive ions produced in the plasma are attracted to the surface 20 of the target 21 where, upon impact, they dislodge particles of the sputtering material of which the target 21 is formed. The dislodged particles propagate toward, impinge upon and adhere to the surface 17 of the wafer 15 to form the thin film thereon.

With the present invention, the surface 17 of the wafer 15 is coated with a thin film of magnetic material sputtered from the target 21. For the deposition of magnetic material onto the substrate 15, a bias magnetic field is employed. Such a field is produced by a biasing magnet assembly 30 situated in the sputtering apparatus 12 partially in the vacuum chamber 11. By way of example, such a biasing magnet assembly 30 is assembled with the wafer support 16, and is mounted to an access door 31 secured to the frame 14 in sealing contact with the wall 13 of the chamber 11. The door 31 is illustrated in phantom in FIG. 1 to facilitate illustration and understanding of the magnet assembly 30. The wafer holder 16 is fixed to a rigid support plate 32 of non-magnetic, and preferably non-metallic, insulating material that is fixed to brackets 33 that are fixed to the door 31. The brackets 33 and door 31 are formed on non-magnetic material such as aluminum. The wafer supports of the patents incorporated above may be the same as the supports 16.

Figure 2A:
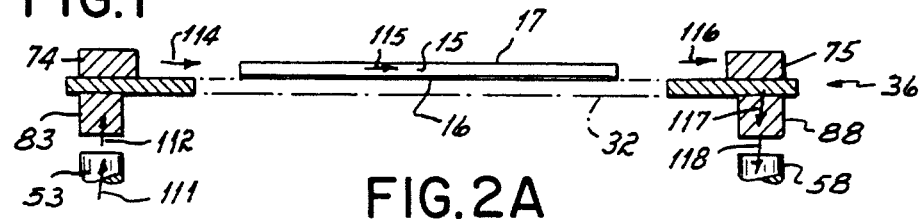
FIG. 2A is a cross-sectional view of the magnet assembly of FIG. 1 as seen along line 2A—2A of FIG. 2.
Figure 2B:
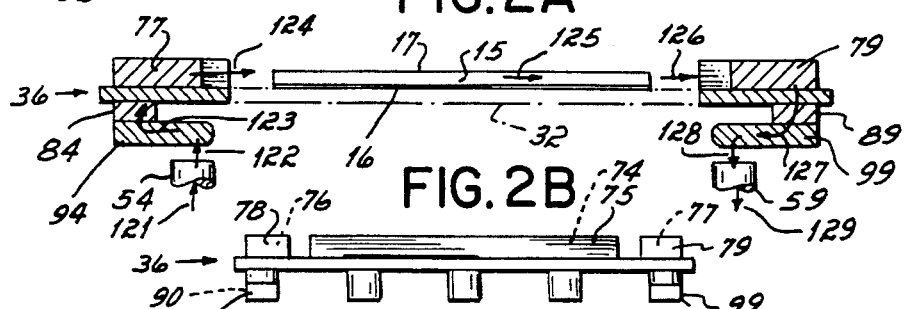
FIG. 2B is a cross-sectional view of the magnet assembly of FIG. 1 as seen along line 2B—2B of FIG. 2.
Figure 2C:
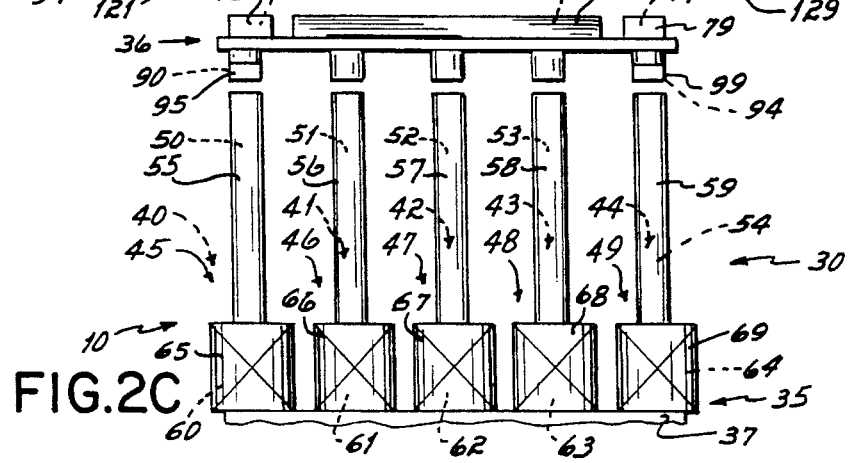
FIG. 2C is a cross-sectional view of the magnet assembly of FIG. 1 as seen along line 2C—2C of FIG. 2.
Figure 2:
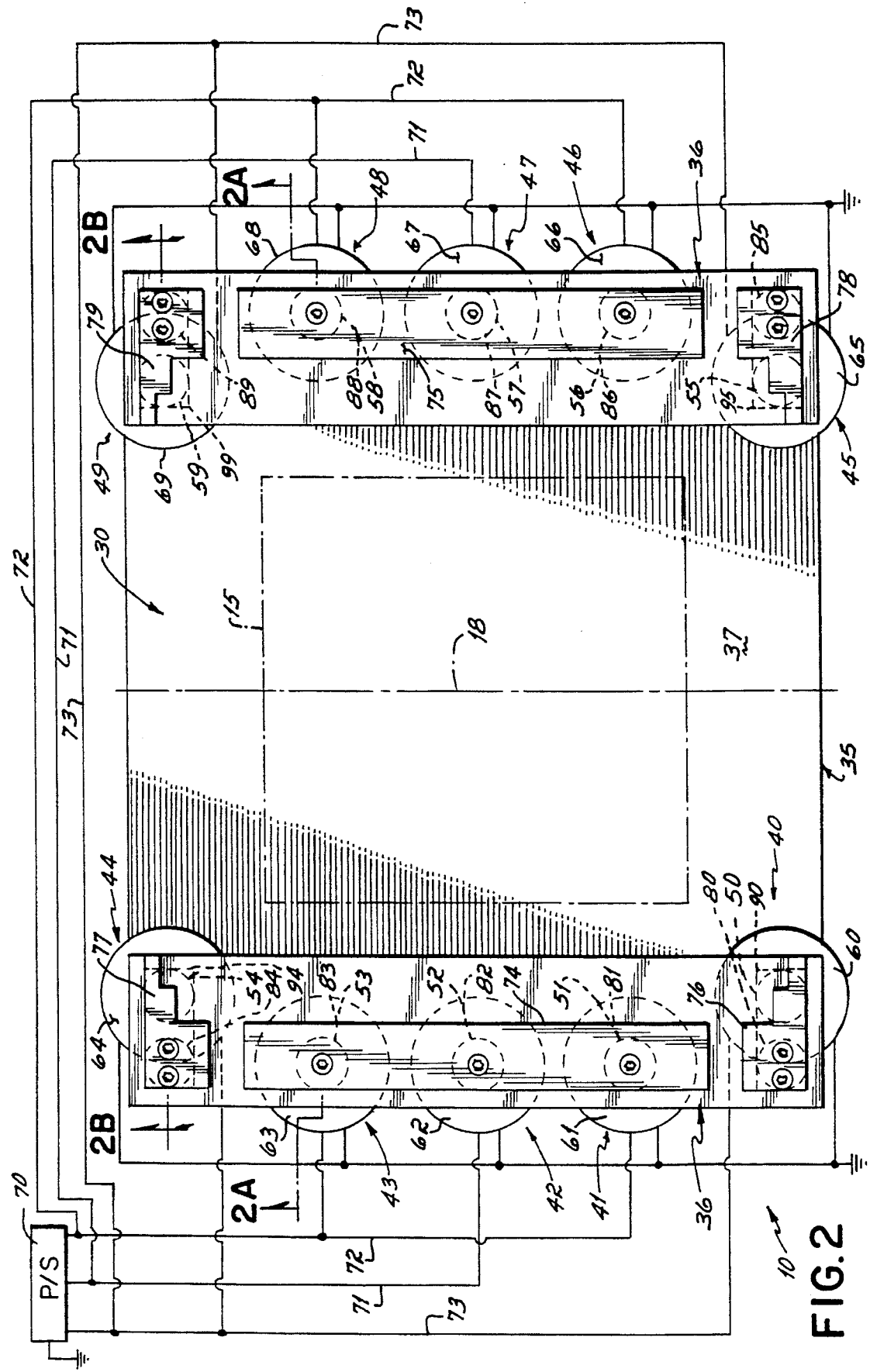
FIG. 2 is a top view of the magnet assembly of FIG. 1 as seen along line 2—2 thereof.

The biasing magnet assembly 30, as illustrated in FIGS. 1–2C, includes a main magnet assembly 35 that may be fixed directly to the outside of the door 31 or otherwise to the machine frame, and a pole piece assembly 36 that may be fixed to the plate 32 on the inside of the door 31 in the chamber 11. The main magnet assembly 35 includes a core plate 37 of high saturation, high permeability magnetic material, preferably rectangular in shape, which is the machine frame 14, example on the inside of a cover plate 38 of a magnet housing 39 which is fixed to the frame 14. The magnet assembly 35 also includes ten magnets 40–49. The magnets 40–49 are arranged on the core plate 37 with five magnets 40–44 along one edge of the core plate 37 and five magnets 45–49 along the opposite and parallel edge of the core plate 37 with the corner ones of the magnets 40, 44, 45 and 49 offset from the edge of the core plate 37, as illustrated in FIG. 2. Each of the magnets 40–49 includes a respective core 50–59 each fixed to and extending perpendicularly from the core plate 37 and the door 31, with the remote ends of the cores 50–59 in close proximity to the outside surface of the door 31. The cores 50–59 are also of the high saturation, high permeability magnetic material. Around each of the cores 50–59 is wound a magnet coil 60–69. The coils 60–69 are connected to a magnet power supply 70, preferably in three separately controllable circuits 71–73. The circuit 71 controls the current to the centermost coils 62 and 67, the circuit 72 controls the current to the coils 61, 63, 66 and 68 that are adjacent the centermost coils 62 and 67, and the circuit 73 controls the current to the corner coils 60, 64, 65 and 69.

Figure 5:
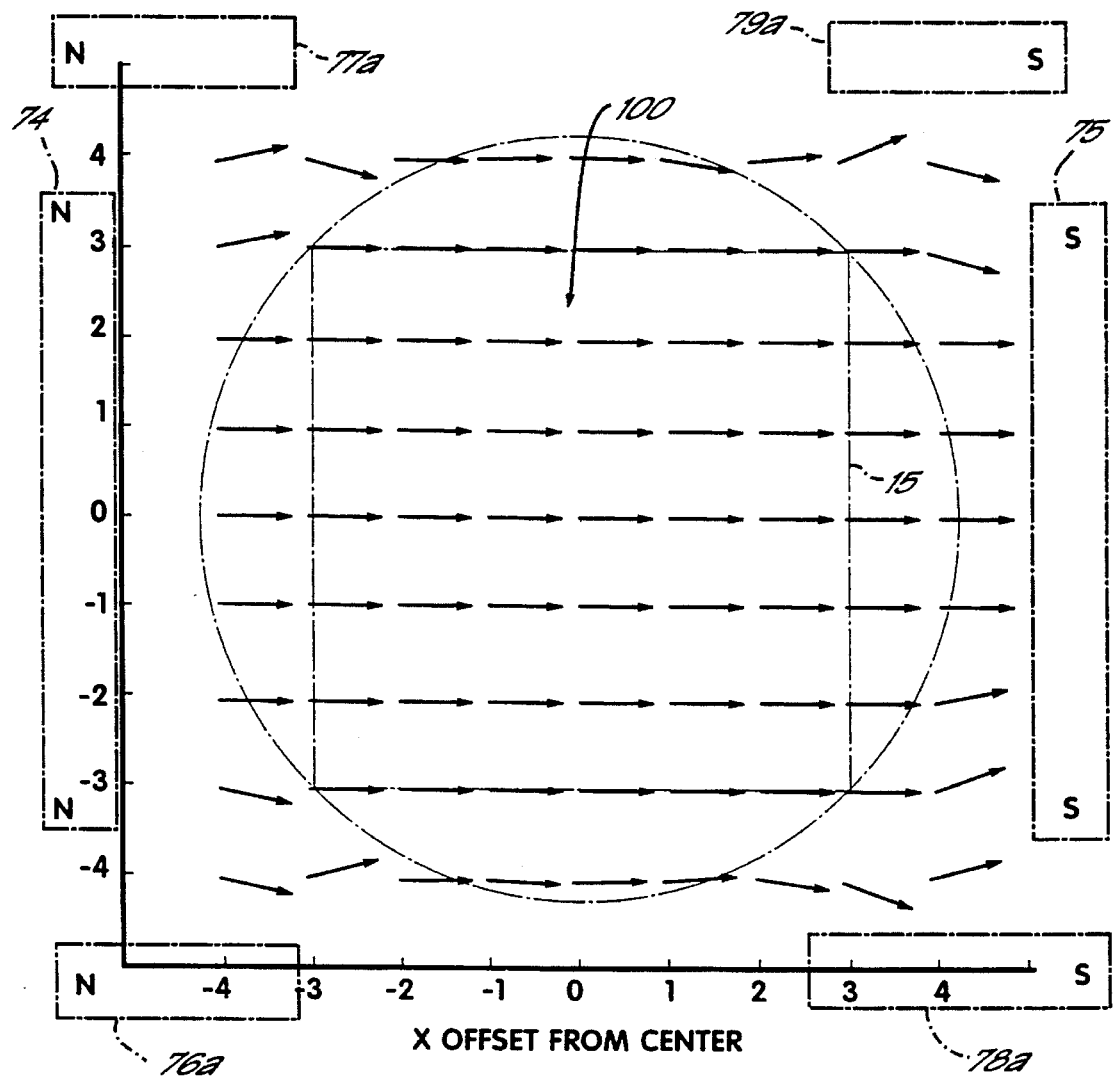
FIG. 5 is a diagram illustrating the resultant magnetic field from the assembly of magnets of the device of FIG. 1.

The pole piece assembly 36 is supported on the plate 32 in spaced relationship with the remote ends of the cores 50–59 on the opposite side of the door 31. The assembly 36 includes a pair of end pole pieces 74 and 75 spaced from each other on opposite sides of the wafer support 16, centered in a plane that contains a wafer 15 held by the wafer support 16. The assembly also includes four corner pole pieces 76–79, one spaced from each end of the end pole pieces 74 and 75 in the same plane. The pole pieces 76–79 are, in one embodiment, as illustrated in FIG. 2, stepped in shape, presenting three corners that face toward the wafer 15, viewed from the top. A first one of the corners is in alignment with the facing corner of the pole piece 74 or 75, a second one of the corners being about one half inch transversely spaced away from the wafer 15 but one half inch forward toward the wafer 15, and a third one of the corners being about another half inch transversely spaced further away from the wafer 15 and one half inch further forward toward the wafer 15. In a second embodiment, alternatively shaped corner pole pieces 76a–79a are provided, as illustrated in FIG. 5, being rectangular in shape and presenting only one corner facing the wafer 15 at the corners thereof, being forward and in line with the edge of the wafer 15, and spaced transversely therefrom.

Associated and aligned, on the opposite or inside of the door 31, with each of the cores 50–59 on the pole piece assembly 36 is a core extension 80–89. The pole pieces 74–79 and the core extensions 80–89 are formed of the same high saturation high permeability magnetic material as the cores 50–59. The core extensions 81–83 and 86–88 have cross-sections identical to those of the cores 50–59, are fixed to and extend perpendicularly respectively from the pole pieces 74 and 75 toward, and are each respectively aligned coaxially with, the cores 51–53 and 56–58. The corner core extensions 80, 84, 85 and 89 extending perpendicularly from the pole pieces 76–79, respectively, with the core extensions 80 and 84 in line with the core extensions 81–83, and the core extensions 85 and 89 in a parallel line with the core extensions 86–88. Each of the corner core extensions 80, 84, 85 and 89 has a terminating end piece 90, 94, 95 and 99 respectively that extends parallel to the plate 32 toward the center plane 18 and terminates directly adjacent the remote end of the core 50, 54, 55 and 59, respectively.

Figure 3:
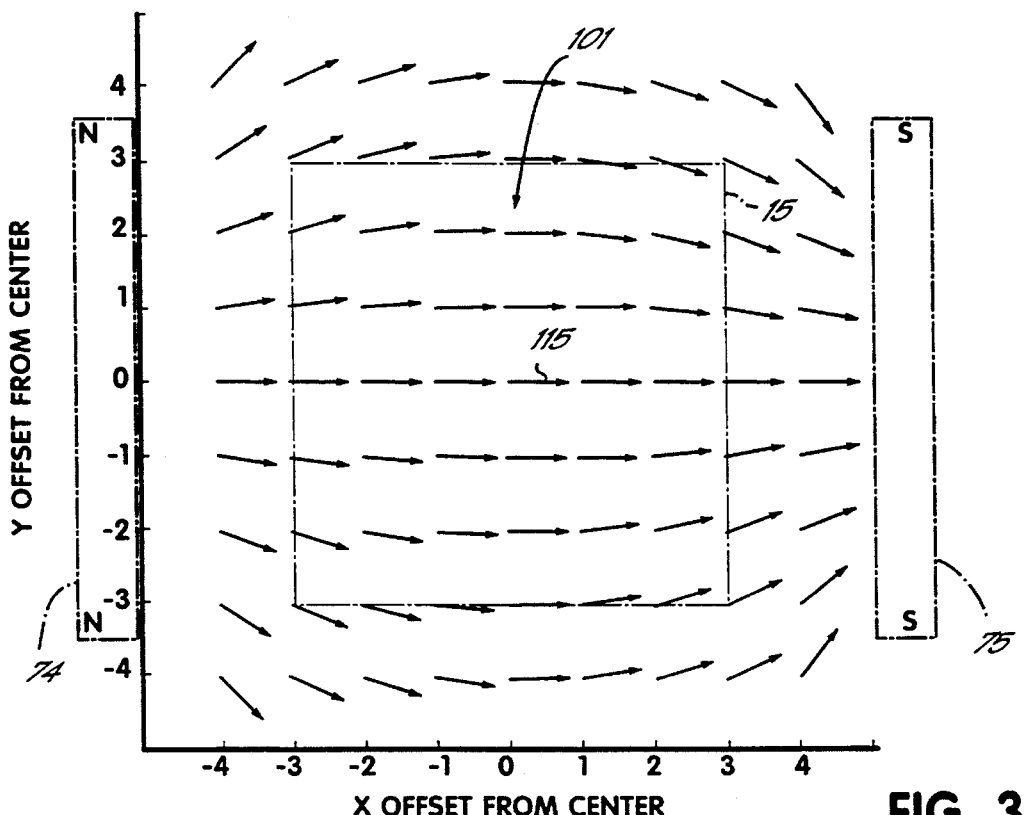
FIG. 3 is a diagram illustrating the magnetic field from the interior magnets of the device of FIG. 1.
Figure 4:
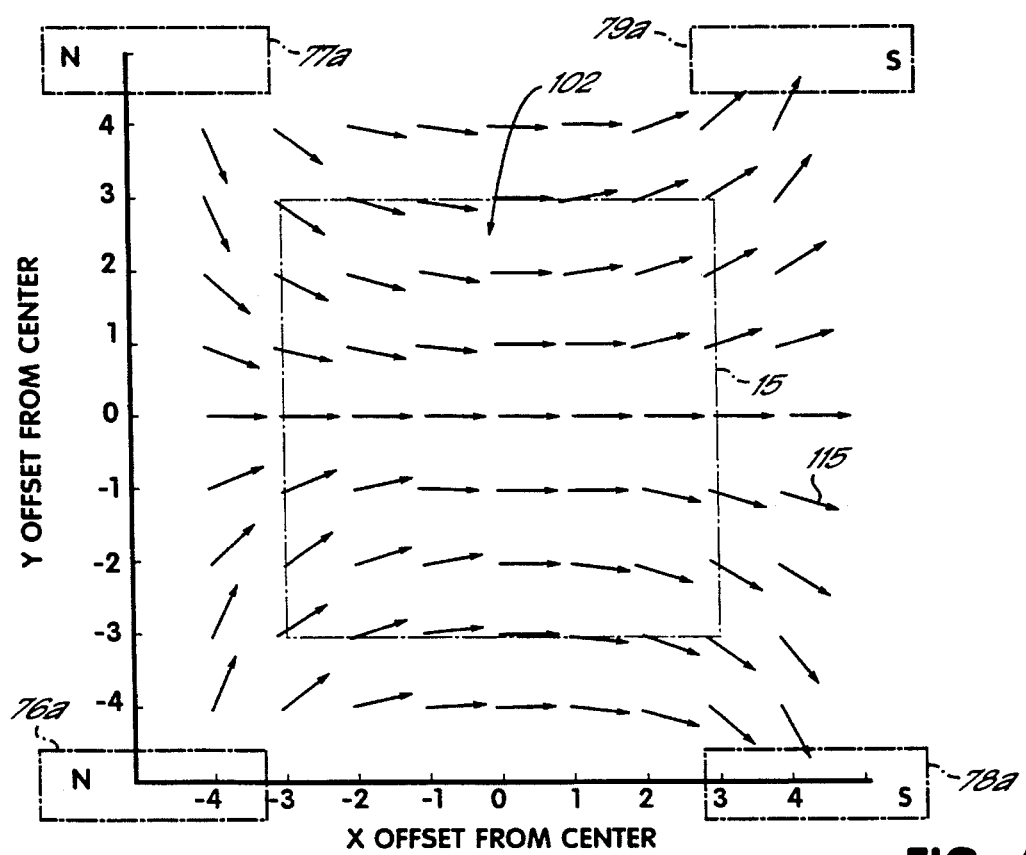
FIG. 4 is a diagram illustrating the magnetic field from the exterior or side magnets of the device of FIG. 1.

When the circuits 71, 72 and 73 are energized, a magnetic field 100 is developed. This field 100 includes two components, an inner field 101 that is generated through the central pole pieces 74 and 75, as illustrated in FIG. 3, and the peripheral magnetic field 102 that is generated through the corner pole pieces 76–79, as illustrated in FIG. 4. The function of the magnet assembly 30 can be best understood by first considering the function of the internal ones 41–43 and 46–48 of the magnets 40–49, with reference to FIGS. 1, 3 and FIG. 4.

The inner field 101 extends through the cores 51–53, which, due to the direction of the current in the magnets 61–63, may be represented by arrows 111, which point in a direction away from the core plate 37. This field passes through the door 31 at the gap between the cores 51–53 and the core extensions 81–83, as represented by the arrows 112, and then bends through the pole piece 74 toward the center plane 18, as illustrated by arrow 114. The inner field 101 then exits the pole piece 74 and propagates across the space occupied by the wafer 15, enveloping and passing edgewise through the wafer 15, as illustrated by the arrows 115 (FIG. 3), over the plane of the wafer support surface 16, to enter the pole piece 75 on the opposite side of the wafer 15. This field 101 then passes through the pole piece 75, as illustrated by arrow 116, axially through the pole piece extensions 86–88, as represented by arrow 117, through the door 31 at the gap at the remote ends of the cores 56–58, as represented by arrow 118, and along the cores 56–58, as illustrated by arrow 119, reinforced in this direction by the currents through the windings 66–68. The field 101 continues to extend, in a closed loop, through the core plate 37, as represented by the arrow 120, where it combines with the field from the corner magnets 40, 44, 45 and 49, as described below, to reenter the cores 52–53.

The portion of the center field 101 in the vicinity of the wafer 15 and represented by the arrows 115 is illustrated in FIG. 3, which shows the field 101 generally parallel at the center of the wafer 15, but diverging in the form of a convex arc at the side edges of the wafer 15, between the pole pieces 74 and 75. The magnet assembly 30 is generally symmetrical about the longitudinal centerline of the wafer 15, and therefore, as illustrated in FIGS. 3 at OFFSET=0, the field 115 is parallel to the longitudinal centerline of the wafer 15 only along its center. The deviation from the required parallelism of the field 101 becomes significant beyond approximately two inches of the center of the wafer 15. This non-parallelism is however cancelled by the outer field 102, as explained below.

Referring again to FIG. 1, the outer field 102 extends through the cores 50 and 54 which, due to the direction of the current in the magnets 60 and 64 may be represented by arrows 121, pointing in a direction away from the core plate 37. This field passes through the door 31 at the gap between the cores 50 and 54, as represented by the arrow 122, then bends through the core extensions 80 and 84, first away from the center plane 18 then toward the pole pieces 76 and 77 or 76a and 77a, as represented by the arrows 123, and then extends through the pole pieces toward the center plane 18, as illustrated by arrows 124. The outer field 101 then exits the pole piece 74 and propagates across the space occupied by the wafer 15, enveloping and passing edgewise through the wafer 15, as illustrated by the arrows 125, to enter the pole pieces 78 and 79 or 78a and 79a on the opposite side of the wafer 15. This field 102 then passes through the pole pieces, as illustrated by arrows 126, axially through the pole piece extensions 85 and 89, as represented by arrows 127, through the door 31 at the gap at the remote ends of the cores 55 and 59, as represented by arrow 128, and along the cores 55 and 59, as illustrated by arrow 129. The field 102 continues to extend, in a closed loop, as illustrated by arrow 120, through the core plate 37 where it combines with the field from the center magnets 41–43 and 46–48, as described below, to reenter the cores 50 and 55.

The portion of the outer field 102 in the vicinity of the wafer 15 and represented by the arrows 125 is illustrated in FIG. 4, which shows the field 102 also generally parallel to the longitudinal centerline of the wafer 15 at the center of the wafer 15 (OFFSET=0), but converging, rather than diverging as with field 101, in a concave arc at the side edges of the wafer 15, between the pole pieces 76a and 78a, and between pole pieces 77a and 79a. This concavity represents a field 102 with a transverse or perpendicular component that cancels the transverse or perpendicular component deviation from the required parallelism of the field 101 over the surface of the wafer 15. As a result, the total magnetic field 100 is parallel over the entire surface of the wafer 15, as illustrated in FIG. 5. This magnetic field 100 is equal to the vector sum of the inner and outer fields 101 and 102.

The adjustment of the field 100 is carried out with field meters that measure the direction of the field 100 across the space to be occupied by a wafer 15, preferably in a chamber 11 or in another environment that simulates all magnetic effects the chamber 11 components on the field of the magnet assembly 30. Generally, the center magnets 42 and 47 and the corner magnets 40, 44, 45 and 49 are set first, with the currents of the corner magnet windings 60, 64, 65 and 69 set at their maximum and the currents of the center magnet windings 62 and 67 set at a value of, for example, sixty percent of the current of the corner magnets 60, 64, 65 and 69. Then, the intermediate magnets 41, 43, 46 and 48 are adjusted by varying the currents to their respective coils 61, 63, 66 and 68 until the proper parallelism is measured in the resultant field 100 over the surface of the wafer.

Figure 6:
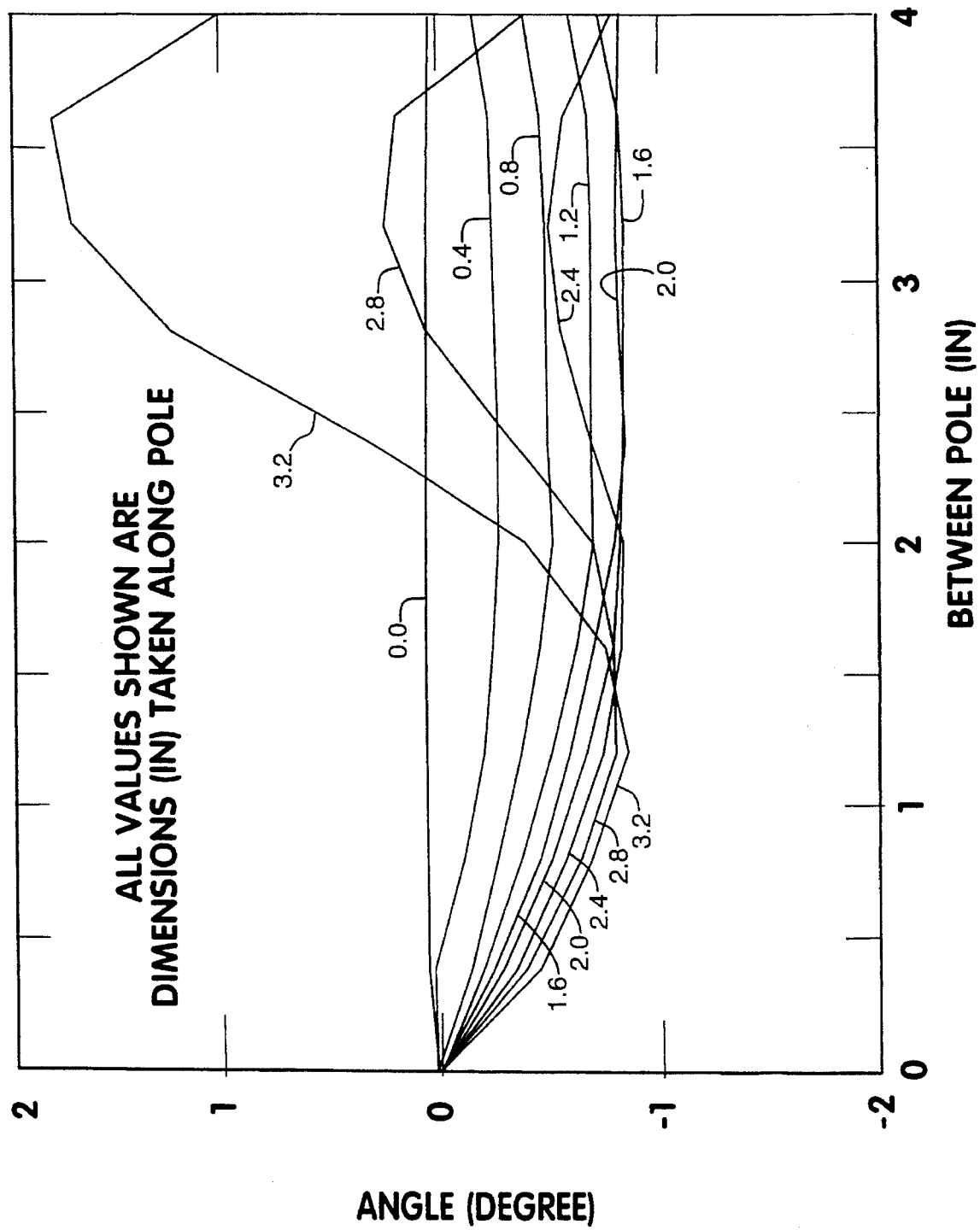
FIG. 6 is a graph representing the angle of departure from parallelism of the field of FIG. 5 at various points on the surface of a wafer being processed.

FIG. 6 illustrates the field measurements that should be obtained for a six inch wafer 15 following proper adjustment of the coil currents in the manner described. Within the 6×6 inch space occupied by the wafer 15, the field is shown as within ±1° of being parallel, with evidence of a deviation from the parallelism of the field 100 occurring only beyond the edge of the six inch square wafer 15. In FIG. 6, the distances are measured from the center of the wafer 15.

From the above description of the preferred embodiments of the invention, it will be apparent to one skilled in the art that variations and modifications can be made without departing from the principles of the invention.

Accordingly, the following is claimed:

1. A sputter coating apparatus having a biasing magnet for magnetically aligning domains in a thin film of material in the deposition thereof onto a substrate, comprising:

a substrate support having a substrate support surface thereon lying in a plane;

a central magnet having a pair of poles spaced a distance apart and located approximately in the plane at opposite ends of the substrate support surface;

a pair of side magnets of approximately equal strength equally spaced on opposite sides of the support surface, each side magnet having a pair of corner poles spaced less than said distance from each other, the pairs of corner poles being approximately equally spaced from the poles of the central magnet on opposite sides thereof;

a pair of adjustable intermediate magnets of approximately equal strength positioned between the central and side magnets, the intermediate magnets each having a pair of poles spaced from each other on opposite ends of the support surface defining a gap therebetween;

the central, intermediate and side magnets having generally parallel polar axes, the poles of each magnet being magnetically interconnected by core material located generally outside of the plane; and the magnets having strengths such that the resultant field therefrom is parallel to within approximately one degree on a substrate when supported in the plane on the substrate support surface.

2. A sputtering apparatus comprising:

a vacuum processing chamber;

a substrate support mounted in the chamber and having a substrate support surface thereon lying in a plane;

a sputtering target cathode assembly mounted in the chamber and comprising a sputtering target of magnetic material facing the substrate support surface and parallel to the plane, the target dimensions parallel to the plane being larger than the substrate support surface;

a chamber anode within the chamber;

a power supply connected between the anode and the cathode assembly;

a central magnet having a pair of poles spaced a distance apart and located approximately in the plane and each spaced from the substrate support surface at opposite ends thereof;

a pair of side magnets spaced on opposite sides of the support surface, each side magnet having a pair of corner poles spaced less than said distance from each other;

a pair of intermediate magnets positioned between the central and side magnets, the intermediate magnets each having a pair of poles spaced from each other on opposite ends of the support surface, the pairs of corner poles being spaced from the poles of the intermediate magnets on opposite sides thereof defining a gap therebetween;

the central, intermediate and side magnets having generally parallel polar axes, the poles of each magnet being magnetically interconnected by a core material located generally outside of the plane;

the central, intermediate and side magnets being arranged in an assembly having dimensions, parallel to the plane, that are at most approximately the dimensions of the cathode assembly; and the magnets respectively having strengths such that they produce a resultant field that is parallel to within approximately one degree on a substrate when supported in the plane on the substrate support surface.

3. A sputter coating biasing magnet apparatus for magnetically aligning a thin film of material being deposited over an area of a substrate supported in a plane on a substrate support surface in a processing chamber of a sputter coating machine comprising:

at least one interior magnet including a central magnet having a pair of poles space a distance apart and located approximately in the plane spaced from the substrate support surface at opposite ends thereof;

a pair of side magnets spaced on opposite sides of the support surface, each side magnet having a pair of corner poles spaced less than said distance from each other the pairs of corner poles being equally spaced from the poles of the central magnet on opposite sides thereof;

the interior and side magnets having generally parallel polar axes, the poles of each magnet being magnetically interconnected by a core material located generally outside of the plane;

the interior and side magnets being arranged in an assembly having dimensions parallel to the plane that are less than approximately the dimensions of the area of the substrate on which the thin film is to be magnetically aligned; and the magnets having strengths such that they produce a resultant field that is substantially parallel in the plane on the area of a substrate when supported on the substrate support surface.

4. The apparatus of claim 3 wherein:

the interior magnets include a pair of intermediate magnets positioned between the central and side magnets, the intermediate magnets each having a pair of poles spaced from each other on opposite ends of the support surface.

5. The apparatus of claims 1, 2 or 4 further comprising:

a central magnet north pole piece located approximately in the plane at one end of the substrate support surface, and a central magnet south pole piece located approximately in the plane at the opposite end of the substrate support surface; and one of the poles of each of the central magnet and each of the intermediate magnets sharing the central magnet north pole piece and the other of the poles of each of the central magnet and each of the intermediate magnets sharing the central magnet south pole piece.

6. The apparatus of claim 5 wherein:

each of the side magnets has a side magnet north pole piece located approximately in the plane and adjacent to and spaced by an air gap from one side of the central magnet north pole piece and a side magnet south pole piece located approximately in the plane adjacent to and spaced by an air gap from the one side of the central magnet south pole piece.

7. The apparatus of claim 6 wherein:

the central magnet north and south pole pieces are each generally rectangular in shape; and the side magnet north and south pole pieces each have at least one outside corner facing the substrate support surface.

8. The apparatus of claim 1, 2 or 3 wherein:

each of the side magnets has a side magnet north pole piece located approximately in the plane adjacent to and spaced by an air gap from one side of one pole of the central magnet and a side magnet south pole piece located approximately in the plane adjacent to and spaced by an air gap from the one side of the other pole of the central magnet.

9. The apparatus of claim 8 wherein:

each of the side magnet pole pieces has at least one outside corner facing the substrate support surface.

10. The apparatus of claim 1, 2 or 3 wherein:

each of the magnets includes a core of material having a saturation of at least approximately 24 kGauss and a permeability of at least approximately 8,000 and at least one direct current carrying coil wrapped around the core.

11. The apparatus of claim 1, 2 or 4 further comprising:

at least ten magnet units, each of the units including a core of material having a saturation of at least approximately 24 kGauss and a permeability of at least approximately 8,000 and at least one direct current carrying coil wrapped around the core; and each of the magnets includes two of the units, one positioned adjacent each pole thereof, the core being oriented perpendicular to the plane.

12. The apparatus of claim 1, 2 or 3 wherein:

the core material interconnecting the poles of the magnets has a permeability of at least approximately eight thousand and a saturation of at least approximately twenty-four thousand Gauss.

13. A sputter coating method of magnetically aligning a film applied to a substrate comprising the steps of:

providing a vacuum processing chamber having, mounted therein, a substrate support having a substrate support surface thereon lying in a plane, a sputtering target cathode assembly having a sputtering target of magnetic material facing the substrate support surface and parallel to the plane, the target having dimensions parallel to the plane that are larger than corresponding dimensions of the substrate support surface, a chamber anode within the chamber and a power supply connected between the anode and cathode assembly;

generating a substantially parallel magnetic field over the plane of the substrate support surface with at least one interior magnet that includes a central magnet having a pair of poles spaced a distance apart and located approximately in the plane spaced from the substrate support surface at opposite ends thereof, and with a pair of side magnets spaced on opposite sides of the support surface and each having a pair of corner poles spaced less than said distance from each other, the interior and side magnets having generally parallel polar axes, the poles of each magnet being magnetically interconnected by a core material located generally outside of the plane, the interior and side magnets being arranged in an assembly having dimensions parallel to the plane that are at most approximately as large as the cathode assembly;

adjusting the magnets relative to each other such that the generated magnetic field is substantially parallel in the plane over the substrate support surface;

supporting a substrate on the support in the chamber; and energizing the power supply to cause magnetic material from the target to be sputtered onto the substrate to form a thin film thereon having the magnetic domains thereof aligned to within one angular degree.

14. The method of claim 13 wherein:

each of the magnets includes a core of material having a saturation of at least approximately 24 kGauss and a permeability of at least approximately 8,000 and at least one direct current carrying coil wrapped around the core; and the adjusting step includes the step of varying currents through the coils of the magnets until the field is parallel over the area.

15. The method of claim 13 wherein:

each of the side magnets has a side magnet north pole piece located approximately in the plane and adjacent to and spaced by an air gap from one side of one pole of the central magnet and a side magnet south pole piece located approximately in the plane adjacent to and spaced by an air gap from the one side of the other pole of the central magnet, each of the side magnet pole pieces having at least one outside corner facing the substrate support surface; and the adjusting step includes the step of varying spacing of the air gap until the field is parallel over the area.

\* \* \* \* \*